US011266043B2

(12) United States Patent
Chen et al.

(10) Patent No.: US 11,266,043 B2
(45) Date of Patent: Mar. 1, 2022

(54) LIQUID COOLANT BASED THERMAL ENERGY MANAGEMENT FOR CONTAINERS RECEIVING PLUGGABLE CIRCUIT MODULES

(71) Applicant: Intel Corporation, Santa Clara, CA (US)

(72) Inventors: Annie Chen, Hillsboro, OR (US); David Rodriguez, Hillsboro, OR (US); Barrett M. Faneuf, Beaverton, OR (US); Juan G. Cevallos, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/913,462

(22) Filed: Mar. 6, 2018

(65) Prior Publication Data
US 2019/0045656 A1 Feb. 7, 2019

(51) Int. Cl.
*H05K 7/20* (2006.01)
*H05K 7/10* (2006.01)
*G06F 1/20* (2006.01)

(52) U.S. Cl.
CPC ............ *H05K 7/2039* (2013.01); *G06F 1/20* (2013.01); *G06F 1/206* (2013.01); *H05K 7/10* (2013.01); *H05K 7/20336* (2013.01); *H05K 7/20509* (2013.01); *G06F 2200/201* (2013.01)

(58) Field of Classification Search
CPC ............ H05K 7/2039; H05K 7/20509; H05K 7/20336; H05K 7/10; G06F 1/20; G06F 1/206; G06F 2200/201
See application file for complete search history.

(56) References Cited

U.S. PATENT DOCUMENTS

| 7,047,640 | B2 * | 5/2006 | Lee | B23K 1/0012 29/890.046 |
| 7,764,504 | B2 * | 7/2010 | Phillips | H01R 13/6582 361/715 |
| 10,588,243 | B2 * | 3/2020 | Little | H01R 24/60 |
| 2005/0208831 | A1 * | 9/2005 | Lee | H05K 9/0058 439/607.06 |
| 2009/0323285 | A1 * | 12/2009 | Ryoson | H01L 23/427 361/700 |

(Continued)

*Primary Examiner* — Stephen S Sul
(74) *Attorney, Agent, or Firm* — Schwabe, Williamson & Wyatt, P.C.

(57) ABSTRACT

Embodiments include apparatuses, methods, and systems for managing thermal energy of a computing device. An apparatus may include a heat pipe physically and thermally attached to a container by a retainer. The container may include a plurality of slots to removably receive various plurality of pluggable circuit modules during a lifetime of the container. The heat pipe may facilitate a liquid coolant flow to remove thermal energy from a plurality of pluggable circuit modules removably received into the plurality of slots of the container. The retainer may have a tensile strength sufficient to withstand repeated receiving and removal of the various plurality of pluggable circuit modules during the lifetime of the container, without degrading the thermal attachment of the heat pipe to the container below a design performance threshold. Other embodiments may also be described and claimed.

11 Claims, 8 Drawing Sheets

(56) References Cited

U.S. PATENT DOCUMENTS

| | | | |
|---|---|---|---|
| 2011/0317964 A1* | 12/2011 | Downs | G02B 6/4201 |
| | | | 385/92 |
| 2013/0048367 A1* | 2/2013 | Ljubijankic | H01R 13/6583 |
| | | | 174/354 |
| 2014/0160671 A1* | 6/2014 | Yang | G06F 1/203 |
| | | | 361/679.47 |
| 2014/0160679 A1* | 6/2014 | Kelty | G02B 6/4269 |
| | | | 361/700 |
| 2016/0066469 A1* | 3/2016 | Salamon | H04Q 1/035 |
| | | | 361/697 |
| 2016/0197424 A1* | 7/2016 | L'Esperance | G02B 6/4269 |
| | | | 439/61 |
| 2017/0142864 A1* | 5/2017 | Chanu | G02B 6/4268 |
| 2018/0199468 A1* | 7/2018 | Hall, III | H05K 7/20418 |
| 2018/0376617 A1* | 12/2018 | Chen | G02B 6/4269 |
| 2019/0025529 A1* | 1/2019 | Chen | G02B 6/4246 |
| 2019/0181582 A1* | 6/2019 | Beltran | G06F 1/20 |
| 2019/0230817 A1* | 7/2019 | Han | H05K 7/1401 |

\* cited by examiner

LIQUID COOLANT BASED THERMAL ENERGY MANAGEMENT FOR CONTAINERS RECEIVING PLUGGABLE CIRCUIT MODULES

FIELD

Embodiments of the present disclosure relate generally to the technical fields of thermal energy management, and more particularly to liquid coolant based thermal energy management for containers.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A container, or a cage, may be any receptacle or enclosure for holding one or more objects used in storage, packaging, and shipping. Objects kept inside of a container may be protected by being inside of its structure. A computing device or system may include multiple components or modules placed within a container, where a component or a module may generate heat or thermal energy. Currently, a computing device or system including multiple components placed within a container may be cooled by air to remove the thermal energy generated by the modules. As the power density of high performance computing systems increases, air cooled solutions may be insufficient for managing thermal energy generated by multiple components or modules of a computing device or system placed within a container.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1B:
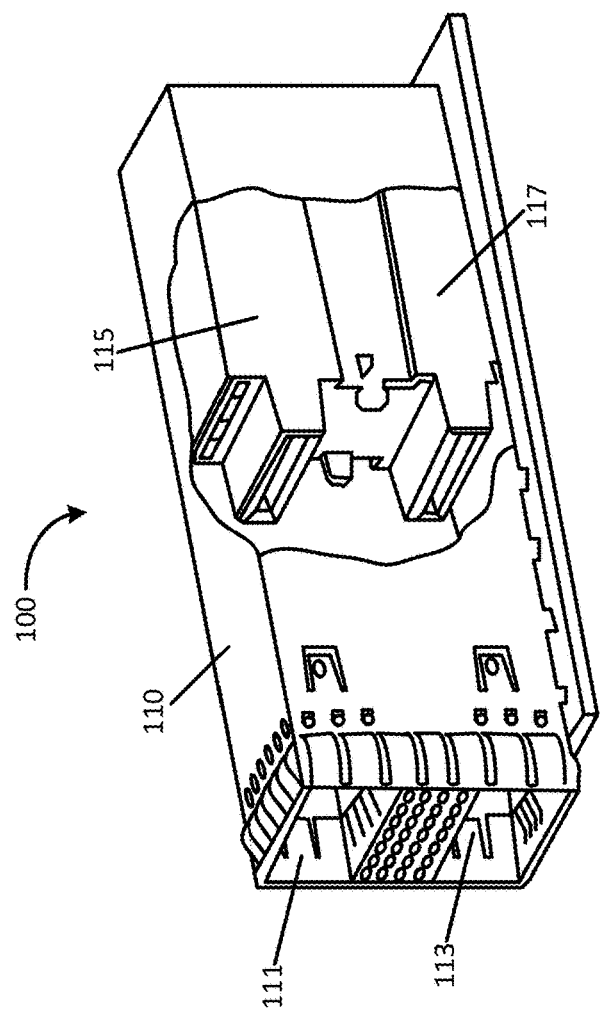
FIGS. 1(a)-1(c) respectively illustrate a perspective view, a cut out view and a block view of an example apparatus for managing thermal energy of a computing device, where the apparatus includes a heat pipe physically and thermally attached to a container by a retainer to facilitate a liquid coolant flow to remove thermal energy, in accordance with various embodiments.

A computing device or system may include multiple components or modules placed within a container, where a component or a module may generate heat or thermal energy. The multiple components of the computing device or system may be in a form of pluggable circuit modules, e.g., optical modules, where a circuit module may be plugged into a container when used for computing, and removed when not used by the computing device. Accordingly, the container may have a plurality of slots to removably receive various plurality of pluggable circuit modules during a lifetime of the container.

Currently, one or more pluggable circuit modules plugged into a container may be air cooled, e.g., by attaching a riding heat sink to the container. There may be certain limits on the capability of an air-cooled solution, e.g., cooling of 7-8 watts while keeping the container temperature below a certain temperature, e.g., 70° C., under typical data center environment. In some embodiments, a pluggable circuit module, e.g., a quad small form factor pluggable, double density (QSFP-DD) module used in a data center, may generate a large amount of thermal energy, e.g., 10 watts. Such high amount of thermal energy generated by a pluggable circuit module may be above the capability of air-cooled solutions. In addition, air-cooled solutions for managing thermal energy of a computing device may be constrained by the size of the container, and the inadequate contact pressures between a pluggable circuit module and the air-cooled solutions.

In embodiments, an apparatus for managing thermal energy of a computing device may include a heat pipe and a retainer to physically and thermally attach the heat pipe to a container. The container may include a plurality of slots to removably receive various plurality of pluggable circuit modules during a lifetime of the container. The heat pipe may facilitate a liquid coolant flow to remove thermal energy from a plurality of pluggable circuit modules removably received into the plurality of slots of the container. The retainer may have a tensile strength sufficient to withstand repeated receiving and removal of the various plurality of pluggable circuit modules during the lifetime of the container, without degrading the thermal attachment of the heat pipe to the container below a design performance threshold.

In embodiments, an apparatus for thermal energy management may include a cold plate attached to a first container, where the cold plate may include a first liquid coolant. A second container may be placed within the first container, where the second container may include a plurality of slots for removably receiving one or more pluggable circuit modules during a lifetime of the second container. A first heat pipe may be attached to the second container, where the first heat pipe may include a second liquid coolant. A thermal conduction path may exist between a pluggable circuit module plugged into the plurality of slots of the second container, the first heat pipe of the second container, and the cold plate of the first container.

A method for managing thermal energy may include: attaching a heat pipe to a container by a retainer. The container may include a plurality of slots for removably receiving various plurality of pluggable circuit modules during the lifetime of the container. The heat pipe may facilitate a liquid coolant flow to remove thermal energy from the various plurality of pluggable circuit modules removably received into the plurality of slots of the container. The retainer may have a tensile strength sufficient to withstand repeated receiving and removal of one or more pluggable circuit modules during the lifetime of the container, without degrading the thermal attachment of the heat pipe to the container below a design performance threshold.

In embodiments, the liquid coolant inside a heat pipe or a cold plate may be provided at a same time when the heat pipe or the cold plate is attached to a container, or provided at a different time by a third party. The liquid coolant may include water, ammonia, freon, or any other coolant liquid.

In the description to follow, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used hereinafter, including the claims, the term "unit," "engine," "module," or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, the term "circuitry" refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a general purpose processing unit (GPU), a single-core processor, a dual-core processor, a triple-core processor, a quad-core processor, and/or any other device capable of executing or otherwise operating computer-executable instructions, such as program code, software modules, and/or functional processes.

As used herein, the term "interface circuitry" may refer to, is part of, or includes circuitry providing for the exchange of information between two or more components or devices. The term "interface circuitry" may refer to one or more hardware interfaces (for example, buses, input/output (I/O) interfaces, peripheral component interfaces, network interface cards, and/or the like).

As used herein, the term "computer device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management Systems (EEMSs), electronic/engine control units (ECUs), vehicle-embedded computer devices (VECDs), autonomous or semi-autonomous driving vehicle (hereinafter, simply ADV) systems, in-vehicle navigation systems, electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

Figure 1A:
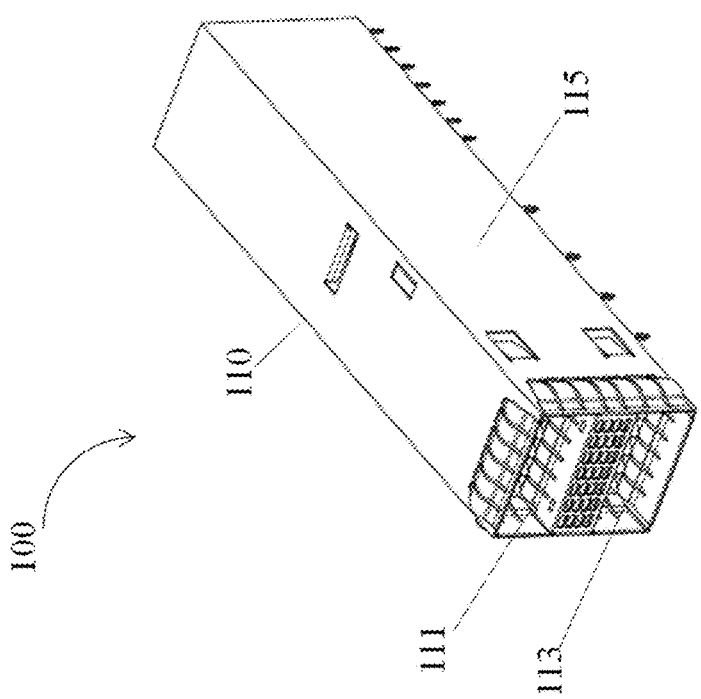
Figure 1C:
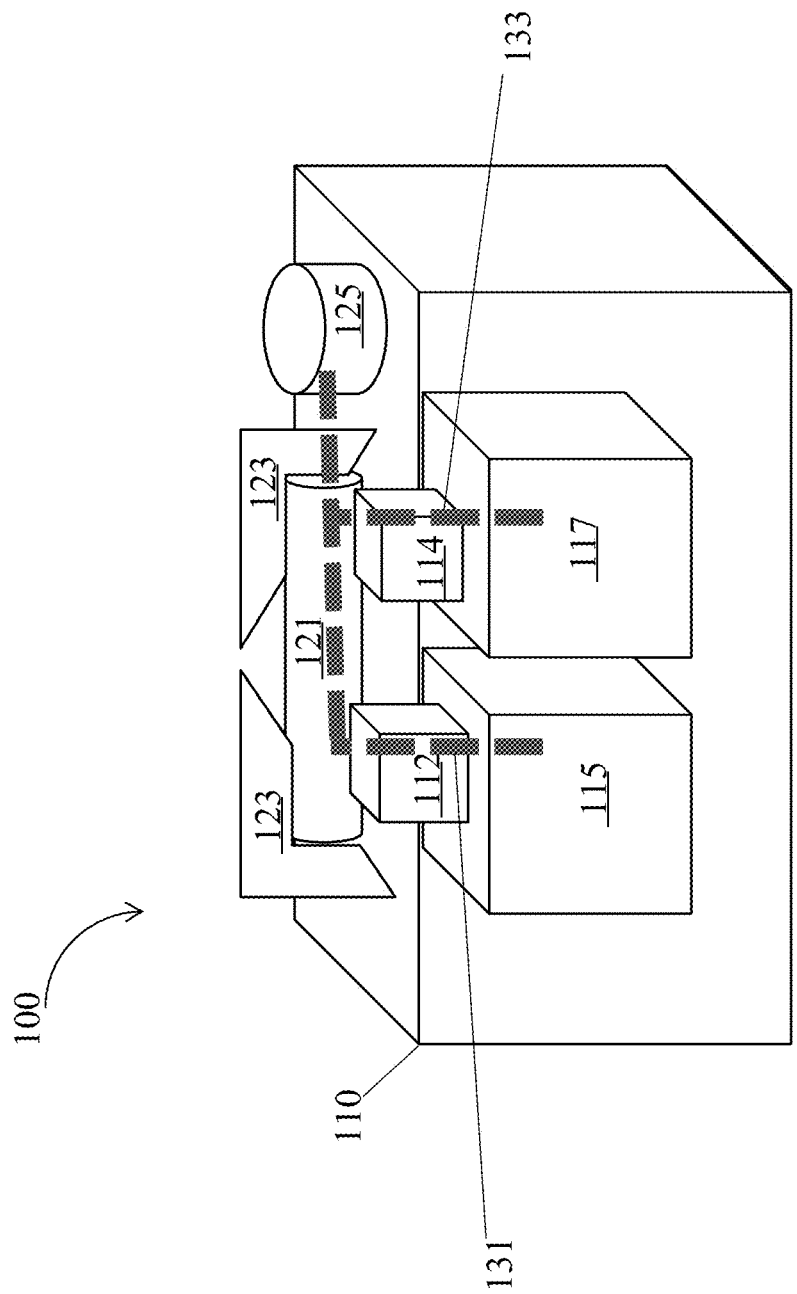

FIGS. 1(a)-1(c) respectively illustrate a perspective view, a cut out view and a block view of an example apparatus 100 for managing thermal energy of a computing device, where the apparatus 100 includes a heat pipe 121 physically and thermally attached to a container 110 by a retainer 123 to facilitate a liquid coolant flow to remove thermal energy, in accordance with various embodiments. For clarity, features of the apparatus 100, the container 110, the heat pipe 121, and the retainer 123 may be described below as an example for understanding an apparatus, a container, a heat pipe, and a retainer. It is to be understood that there may be more or fewer components included in the apparatus 100, the container 110, the heat pipe 121, and the retainer 123. Further, it is to be understood that one or more of the devices and components within the apparatus 100, the container 110, the heat pipe 121, and the retainer 123 may include additional and/or varying features from the description below, and may include any devices and components that one having ordinary skill in the art would consider and/or refer to as the devices and components of an apparatus, a container, a heat pipe, and a retainer.

In embodiments, as illustrated in FIG. 1(a), the apparatus 100 may include the container 110 with an outer surface 115. The container 110 may include a slot 111 and a slot 113. A pluggable circuit module 115, as illustrated in FIG. 1(b), may be placed within the container 110 through the slot 111, and a pluggable circuit module 117, as illustrated in FIG. 1(b), may be placed within the container 110 through the slot 113. As illustrated in FIG. 1(c), the retainer 123 may physically and thermally attach the heat pipe 121 to the container 110. Further, a heat sink 112 may be attached to the container 110, thermally coupled to the heat pipe 121, and in physical and thermal contact with the pluggable circuit module 115. A heat sink 114 may be attached to the container 110, thermally coupled to the heat pipe 121, and in physical and thermal contact with the pluggable circuit module 117. A heat spreader 125 may be coupled to the heat pipe 121. A thermal conduction path 131 may exist between the heat spreader 125, the heat pipe 121, the heat sink 112, and the pluggable circuit module 115 plugged into the container 110. A thermal conduction path 133 may exist between the heat spreader 125, the heat pipe 121, the heat sink 114, and the pluggable circuit module 117 plugged into the container 110. Hence, the thermal conduction path 131 or the thermal conduction path 133 may include both liquid cooled heat pipe 121 integrated with the heat sink 112 or the heat sink 114, which are further coupled to the heat spreader 125. Such thermal conduction paths may provide proper loading and tolerance to allow the apparatus 100 to be stable thorough many insertion and extraction cycles of the pluggable circuit module 115 or the pluggable circuit module 117.

In embodiments, the apparatus 100 may use the heat pipe 121, the heat sink 112, the heat sink 114, and the heat spreader 125 to manage thermal energy of the computing device, which may include one or more pluggable circuit modules, e.g., the pluggable circuit module 115 and the pluggable circuit module 117, plugged into the container 110. The heat pipe 121, the heat sink 112, the heat sink 114, and the heat spreader 125 together may meet a design performance threshold for the container 110, e.g., to cool 10 watts to 70 degrees Celsius for the container 110. The container 110 may have one or more slots organized in an array to removably receive various plurality of pluggable circuit modules, e.g., the pluggable circuit module 115 and the pluggable circuit module 117, during a lifetime of the container 110. The heat pipe 121 may facilitate a liquid coolant flow to remove thermal energy from the plurality of pluggable circuit modules. The heat generated by the pluggable circuit module 115 may be dissipated through the thermal conduction path 131 along the heat spreader 125, the heat pipe 121, and the heat sink 112. Similarly, the heat generated by the pluggable circuit module 117 may be dissipated through the thermal conduction path 133 along the heat spreader 125, the heat pipe 121, and the heat sink 114. Hence, the heat pipe 121 may be shared by more than one pluggable modules, e.g., the pluggable circuit module 115 and the pluggable circuit module 117. On the other hand, the heat sink 112 may only be in dry contact with the pluggable circuit module 115, and the heat sink 114 may only be in dry contact with the pluggable circuit module 117. Furthermore, the heat spreader 125 may be shared between the pluggable circuit module 115 and the pluggable circuit module 117. The heat spreader 125 may be directly coupled to the heat pipe 121. For example, the heat spreader 125 may be soldered to the heat pipe 121.

In embodiments, one or more pluggable circuit modules, e.g., the pluggable circuit module 115 and the pluggable circuit module 117, may be a part of a computing device. For example, the pluggable circuit module 115 and the pluggable circuit module 117 may be a small form-factor pluggable (SFP) module, a compact small form-factor pluggable (CSFP) module, a quad small form-factor pluggable (QSFP) module, or a quad small form-factor pluggable (QSFP)-DD double density module. The one or more pluggable circuit modules, e.g., the pluggable circuit module 115 and the pluggable circuit module 117, placed within the container 110, may be organized into a 2*1 array, a 2*2 array, or some other regular pattern.

In embodiments, the heat pipe 121 may facilitate a liquid coolant flow to remove thermal energy from a plurality of pluggable circuit modules, e.g., the pluggable circuit module 115 and the pluggable circuit module 117. The liquid coolant may include water, ammonia, or freon. The heat pipe 121 may include a S-shaped section, a U-shaped section, or a straight line section. The heat pipe 121 may be a part of a thermal conduction path coupled to the plurality of pluggable circuit modules, e.g., the pluggable circuit module 115 and the pluggable circuit module 117. In some embodiments, the heat pipe 121 may be placed on the outer surface 115 of the container 110. The heat pipe 121 may be a portion of the thermal conduction path 131 including the heat spreader 125, the heat pipe 121, and the heat sink 112. Similarly, the heat pipe 121 may be a portion of the thermal conduction path 133 including the heat spreader 125, the heat pipe 121, and the heat sink 114. In some other embodiments, a portion of the thermal conduction path, e.g., the thermal conduction path 131, or the thermal conduction path 133, may be embedded into a recess of the container 110.

In embodiments, the retainer 123 may physically and thermally attach the heat pipe 121 to the container 110. The retainer 123 may have a tensile strength sufficient to withstand repeated receiving and removal of the various plurality of pluggable circuit modules, e.g., the pluggable circuit module 115 and the pluggable circuit module 117, during the lifetime of the container 110, without degrading the thermal attachment of the heat pipe 121 to the container 110 below a design performance threshold. The lifetime of the container 110 may be in a range of about 50 to 5000 repeated receiving and removal for the various plurality of pluggable circuit modules. The retainer 123 may be a spring metal clip, a torsion spring, a fastener, a cable, a chain, a wrap, or a hinge. The retainer 123 may be attached to the outer surface 115 of the container 110, or inside the container 110. The retainer 123 may include stainless steel, carbon steel, or alloy steel, with the tensile strength in a range of 2 lbs to 15 lbs.

In embodiments, the heat sink 112, the heat sink 114, and the heat spreader 125 may include copper or aluminum, and may be attached to the outer surface 115 of the container 110 by a spring metal clip. The heat sink 112 and the heat sink 114 may be attached to a portion of a surface of the container 110, and thermally coupled to the heat pipe 121. In addition, the heat sink 112 may be in physical and thermal contact, e.g., in dry contact, with the pluggable circuit module 115. Similarly, the heat sink 114 may be in physical and thermal contact, e.g., in dry contact, with the pluggable circuit module 117. The dry contact between the heat sink 112 and the pluggable circuit module 115, or between the heat sink 114 and the pluggable circuit module 117, may improve flexibility of the design to provide improved thermal performances for multiple insertions and extractions of the pluggable circuit module 115, or the pluggable circuit module 117.

Figure 2:
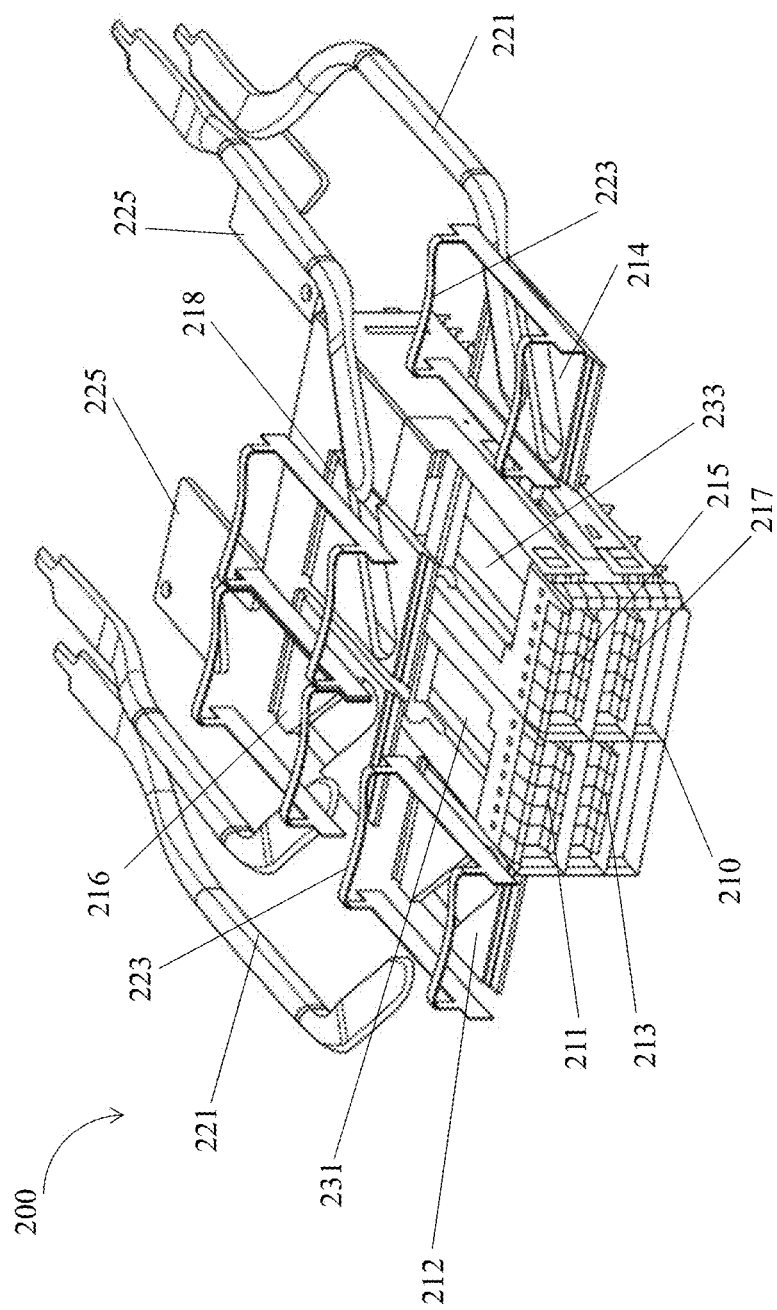
FIG. 2 illustrates another example apparatus for managing thermal energy of a computing device, where the apparatus includes a heat pipe physically and thermally attached to a container by a retainer to facilitate a liquid coolant flow to remove thermal energy, in accordance with various embodiments.

FIG. 2 illustrates another example apparatus 200 for managing thermal energy of a computing device, where the apparatus includes a heat pipe 221 physically and thermally attached to a container 210 by a retainer 223 to facilitate a liquid coolant flow to remove thermal energy, in accordance with various embodiments. In embodiments, the container 210, the heat pipe 221, and the retainer 223 may be an example of the container 110, the heat pipe 121, and the retainer 123, as shown in FIG. 1.

In embodiments, the container 210 may include a slot 211, a slot 213, a slot 215, and a slot 217, where one or more pluggable circuit modules may be placed within the container 210 through the slots. The retainer 223 may physically and thermally attach the heat pipe 221 to the container 210. There may be multiple components of the heat pipe 221. A heat sink 212 may be attached to the container 210, thermally coupled to the heat pipe 221, and in physical and thermal contact with a pluggable circuit module, not shown. Similarly, a heat sink 214, a heat sink 216, and a heat sink 218, may be attached to the container 210, thermally coupled to the heat pipe 221, and in physical and thermal contact with a pluggable circuit module. The heat sink 212 may be placed into a recess 231 of the container 210, while a heat sink 214 may be placed into a recess 233 of the container 210. A heat spreader 225 may be coupled to the heat pipe 221.

In embodiments, the apparatus 200 may use the heat pipe 221, the heat sink 212, the heat sink 214, the heat sink 216, the heat sink 218, and the heat spreader 225 to manage thermal energy of the computing device, which may include one or more pluggable circuit modules plugged into the container 210 through the slot 211, the slot 213, the slot 215, and the slot 217. The heat pipe 221, the heat sink 212, the heat sink 214, the heat sink 216, the heat sink 218, and the heat spreader 225 together may meet a design performance threshold for the container 210, e.g., to cool 10 watts to 70 degrees Celsius for the container 210.

The heat generated by a pluggable circuit module may be dissipated through a thermal conduction path along a heat sink, the heat pipe 221, and the heat spreader 225, where a heat sink may be attached to an individual pluggable circuit module. Hence, the heat pipe 221 may be shared by more than one pluggable modules, while a heat sink may only be in dry contact with the pluggable circuit module. Furthermore, the heat spreader 225 may be shared between the multiple pluggable circuit modules.

Figure 3:
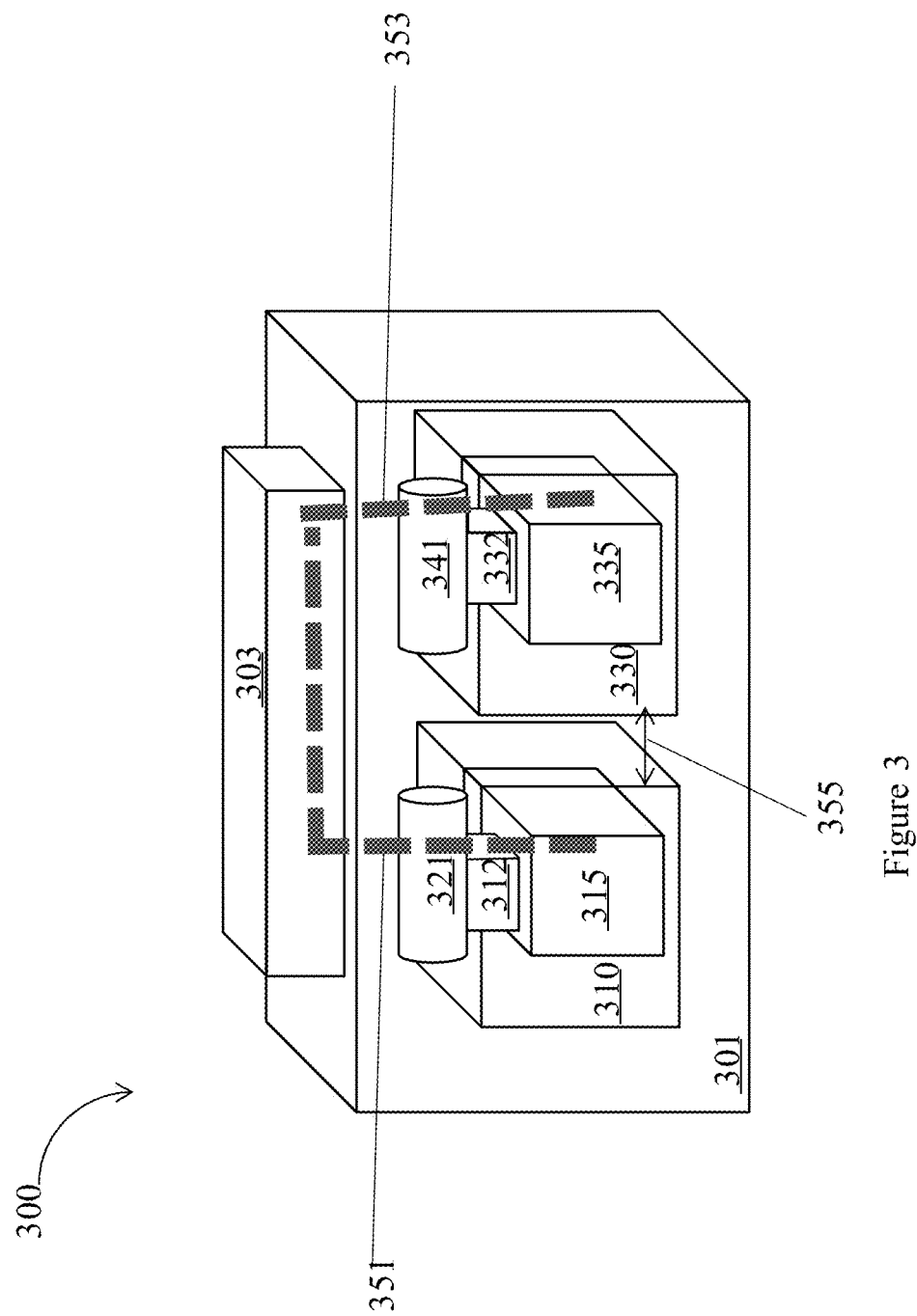
FIG. 3 illustrates an example apparatus for managing thermal energy of a computing device, where the apparatus includes a cold plate attached to a first container, and a second container is placed within the first container, in accordance with various embodiments.

FIG. 3 illustrates an example apparatus 300 for managing thermal energy of a computing device, where the apparatus 300 includes a cold plate 303 attached to a first container 301, and a second container 310 or a third container 330 is placed within the first container 301, in accordance with various embodiments. In embodiments, the second container 310 or the third container 330 may be an example of the container 110 shown in FIG. 1. For example, a pluggable circuit module 315 may be placed within the second container 310, while a heat pipe 321, and a heat sink 312 may be used to manage thermal energy of the pluggable circuit module 315.

In embodiments, the cold plate 303 may be attached to the first container 301, where the cold plate 303 may include a first liquid coolant, which may include water, ammonia, freon, or other liquid. One or more containers, e.g., the second container 310 or the third container 330, may be placed within the first container 301. The second container 310 and the third container 330 may be similar to the container 110 shown in FIG. 1. The second container 310 and the third container 330 may be separated by a gap or a pitch 355. For example, the pitch 355 between the second container 310 and the third container 330 may be in a range of 5 millimeter (mm) to 15 mm.

The second container 310 may include the pluggable circuit module 315, the heat sink 312, and the heat pipe 321, where a thermal conduction path may exist between the heat pipe 321, the pluggable circuit module 315, and the heat sink 312. Similarly, the third container 330 may include a pluggable circuit module 335, a heat sink 332, and a heat pipe 341, where a thermal conduction path may exist between the heat pipe 341, the pluggable circuit module 335, and the heat sink 332. In addition, a thermal conduction path 351 may exist between the heat pipe 321 and the cold plate 303, and a thermal conduction path 353 may exist between the heat pipe 341 and the cold plate 303. The cold plate 303 may include a liquid coolant flow to remove thermal energy from the pluggable circuit module 315 plugged into the container 310, or the pluggable circuit module 335 plugged into the container 330.

In embodiments, the second container 310 may include a plurality of slots for removably receiving one or more pluggable circuit modules, e.g., the pluggable circuit module 315, during a lifetime of the second container 310. Similarly, the third container 330 may include a plurality of slots for removably receiving one or more pluggable circuit modules, e.g., the pluggable circuit module 335, during a lifetime of the third container 330.

Figure 4A:
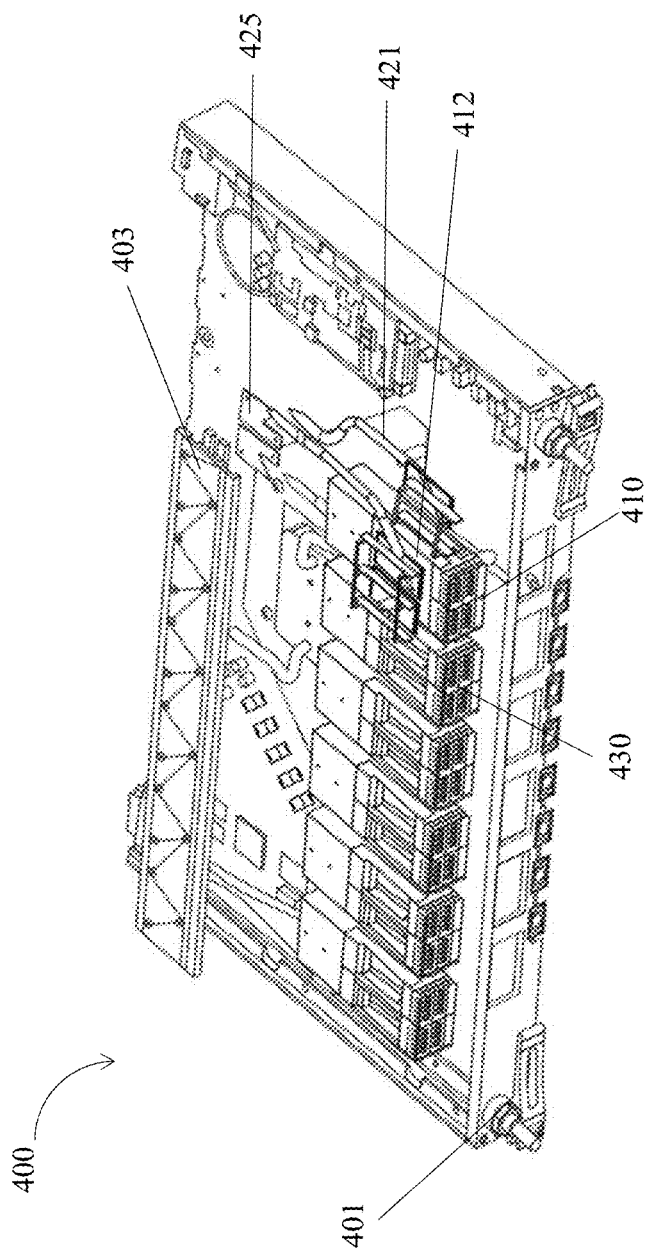
FIGS. 4(a)-4(b) illustrate two perspective views of another example apparatus for managing thermal energy of a computing device, where the apparatus includes a cold plate attached to a first container, and a second container is placed within the first container, in accordance with various embodiments.
Figure 4B:
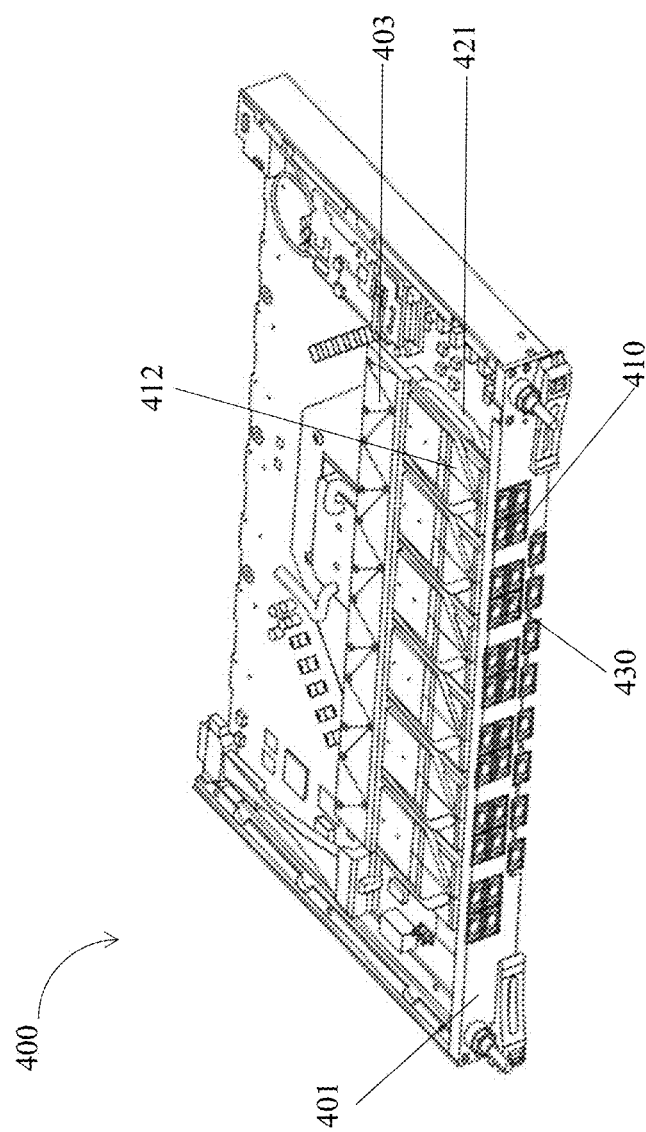

FIGS. 4(a)-4(b) illustrate two perspective views of an example apparatus 400 for managing thermal energy of a computing device, where the apparatus includes a cold plate 403 attached to a first container 401, and a second container, e.g., a container 410 or a container 430, is placed within the first container 401, in accordance with various embodiments. In embodiments, the first container 401, the container 410, the container 430, and the cold plate 403 may be examples of the first container 301, the second container 310, the third container 330, and the cold plate 303 as shown in FIG. 3. In addition, the container 410 or the container 430 may be examples of the container 110 shown in FIG. 1.

In embodiments, the cold plate 403 may be attached to the first container 401. The cold plate 403 may be in an open position as shown in FIG. 4(a), and in a closed position as shown in FIG. 4(b). The cold plate 403 may include a liquid coolant, which may include water, ammonia, freon, or other liquid. One or more containers, e.g., the container 410, the container 430, and a few other containers, may be placed within the first container 401. In detail, the container 410 may include one or more pluggable circuit modules, not shown. In addition, the container 410 may include a heat sink 412, a heat pipe 421, and a heat spreader 425, where a thermal conduction path may exist between a pluggable circuit module, the heat sink 412, the heat pipe 421, and the heat spreader 425. Other containers, e.g., the container 430, may include similar heat sinks, heat pipes, and heat spreaders. A thermal conduction path may exist between a pluggable circuit module, the heat sink 412, the heat pipe 421, the heat spreader 425, and the cold plate 403.

Figure 5:
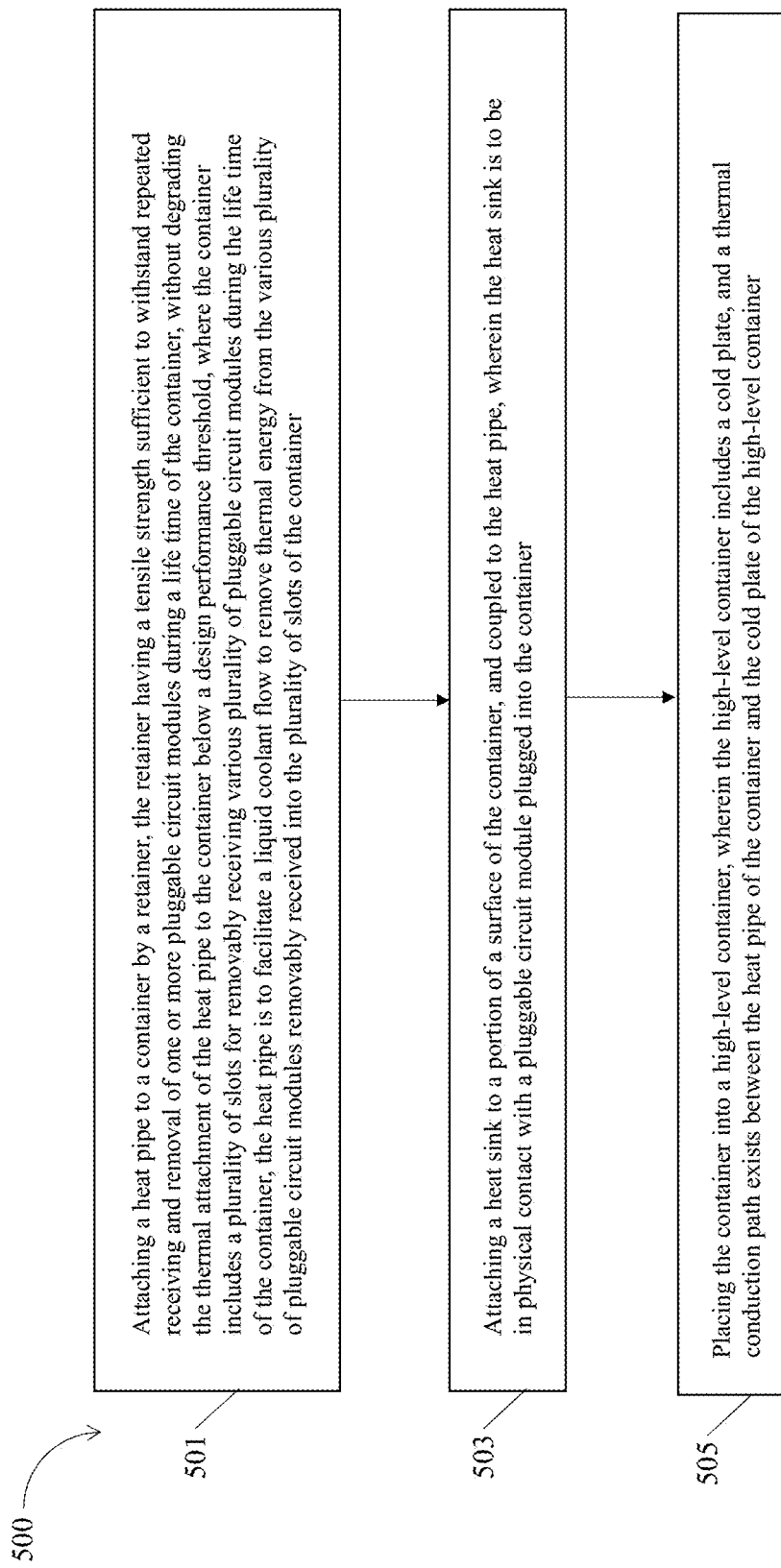
FIG. 5 illustrates an example process for managing thermal energy by a heat pipe attached to a container by a retainer, in accordance with various embodiments.

FIG. 5 illustrates an example process 500 for managing thermal energy by a heat pipe attached to a container by a retainer, in accordance with various embodiments. In embodiments, the process 500 may be performed to attach the heat pipe 121 to the container 110 by the retainer 123, as shown in FIG. 1, or the container 310 and the container 301 as shown in FIG. 3.

The process 500 may start at an interaction 501. During the interaction 501, a heat pipe may be attached to a container by a retainer. The container may include a plurality of slots for removably receiving various plurality of pluggable circuit modules during the lifetime of the container. The heat pipe may facilitate a liquid coolant flow to remove thermal energy from the various plurality of pluggable circuit modules removably received into the plurality of slots of the container. The retainer may have a tensile strength sufficient to withstand repeated receiving and removal of one or more pluggable circuit modules during a lifetime of the container, without degrading the thermal attachment of the heat pipe to the container below a design performance threshold. For example, at the interaction 501, the heat pipe 121 may be attached to the container 110 by the retainer 123. The container 110 may include a plurality of slots, e.g., the slot 111 or the slot 113, for removably receiving various plurality of pluggable circuit modules, e.g., the pluggable circuit module 115 or the pluggable circuit module 117, during the lifetime of the container. The heat pipe 121 may facilitate a liquid coolant flow to remove thermal energy from the various plurality of pluggable circuit modules removably received into the plurality of slots of the container, e.g., the slot 111 or the slot 113. The retainer 123 may have a tensile strength sufficient to withstand repeated receiving and removal of one or more pluggable circuit modules during a lifetime of the container 110, without degrading the thermal attachment of the heat pipe to the container below a design performance threshold. For example, the retainer 123 may have a tensile strength sufficient to withstand about 50 to 5000 repeated receiving and removal of one or more pluggable circuit modules during a lifetime of the container 110. During repeated usages, e.g., the 50 to 5000 range of repeated receiving and removal of one or more pluggable circuit modules, the heat pipe 121 may meet a design performance threshold for the container 110, e.g., to cool 10 watts to 70 degrees Celsius for the container 110.

During an interaction 503, operations may be performed to attach a heat sink to a portion of a surface of the container, and coupled to the heat pipe, wherein the heat sink is to be in physical contact with a pluggable circuit module plugged into the container. For example, at the interaction 503, operations may be performed to attach the heat sink 112 to a portion of the outer surface 115 of the container 110, and coupled to the heat pipe 110, wherein the heat sink 112 may be in physical contact with the pluggable circuit module 115 plugged into the container 110.

During an interaction 505, operations may be performed to place the container into a high-level container, wherein the high-level container includes a cold plate, and a thermal conduction path may exist between the heat pipe of the container and the cold plate of the high-level container. For example, at the interaction 505, operations may be performed to place the container 310 into the container 301, which may be a high-level container. The container 301 may include the cold plate 303. A thermal conduction path may exist between the heat pipe 321 of the container 310 and the cold plate 303 of the container 301. The use of a high-level container, e.g., the container 301, may further include more pluggable circuit modules into one container, with different layers of thermal energy managements. For example, the heat sink 312 may be thermally coupled to the heat pipe 321, and in physical and thermal contact with the pluggable circuit module 315. The heat pipe 321 may be shared by multiple pluggable circuit modules within the container 310. Furthermore, the cold plate 303 may be shared by multiple pluggable circuit modules within the container 310 and within the container 330.

Figure 6:
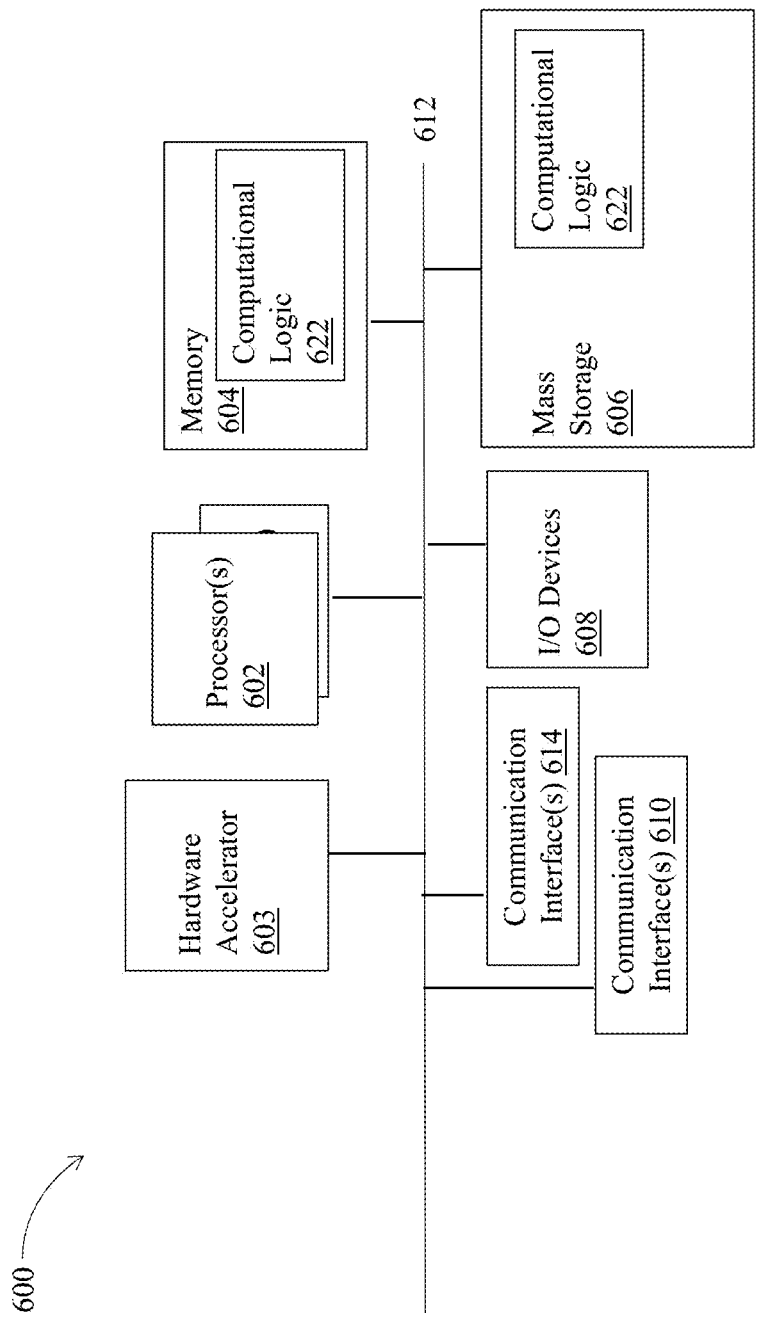
FIG. 6 illustrates an example device suitable for use to practice various aspects of the present disclosure, in accordance with various embodiments.

FIG. 6 illustrates an example device 600 that may be suitable as a device to practice selected aspects of the present disclosure. The device 600 may be an example of the pluggable circuit module 115, the pluggable circuit module 117, the pluggable circuit module 315, the pluggable circuit module 317, as shown in FIG. 1 or FIG. 3. The thermal energy generated by device 600 during operation, after device 600 has been removably plugged into a slot of a container having the thermal energy management arrangement earlier described, may be advantageously and efficiently removed, allowing the components of device 600 to pack more power and provide more computational capabilities.

As shown, the device 600 may include one or more processors 602, each having one or more processor cores, and optionally, a hardware accelerator 603 (which may be an ASIC or a FPGA). In alternate embodiments, the hardware accelerator 603 may be part of processor 602, or integrated together on a SOC. Additionally, the device 600 may include a memory 604, which may be any one of a number of known persistent storage medium, and mass storage 606. Furthermore, the device 600 may include communication interfaces 610 and 614. Communication interfaces 610 and 614 may be any one of a number of known communication interfaces. In addition, the 600 may include input/output devices 608. In embodiments, one or more (or aspects thereof) of the process 500 may be implemented with as part of computational logic 622. The elements may be coupled to each other via system bus 612, which may represent one or more buses. In the case of multiple buses, they may be bridged by one or more bus bridges (not shown).

Each of these elements may perform its conventional functions known in the art. In particular, system memory 604 may be employed to store a working copy and a permanent copy of the programming instructions implementing the operations associated with an operating system and one or more applications, collectively referred to as computational logic 622. The computational logic 622 may be implemented by assembler instructions supported by processor(s) 602 or high-level languages, such as, for example, C, that can be compiled into such instructions.

The various elements may be implemented by assembler instructions supported by processor(s) 602 or high-level languages, such as, for example, C, that can be compiled into such instructions. Operations associated with safety operations and configuration of safety operations not implemented in software may be implemented in hardware, e.g., via hardware accelerator 603.

The number, capability and/or capacity of these elements 601-622 may vary, depending on the number of other devices the device 600 is configured to support. Otherwise, the constitutions of elements 601-622 are known, and accordingly will not be further described.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module," or "system."

Thus various example embodiments of the present disclosure have been described including, but are not limited to:

Example 1 may include an apparatus for managing thermal energy of a computing device, comprising: a heat pipe to facilitate a liquid coolant flow to remove thermal energy from a plurality of pluggable circuit modules removably received into a plurality of slots of a container, wherein the container having the plurality of slots removably receives various plurality of pluggable circuit modules during a lifetime of the container; and a retainer to physically and thermally attach the heat pipe to the container, the retainer having a tensile strength sufficient to withstand repeated receiving and removal of the various plurality of pluggable circuit modules during the lifetime of the container, without degrading the thermal attachment of the heat pipe to the container below a design performance threshold.

Example 2 may include the apparatus of example 1 and/or some other examples herein, wherein the plurality of pluggable circuit modules include a small form-factor pluggable (SFP) module, a compact small form-factor pluggable (CSFP) module, a quad small form-factor pluggable (QSFP) module, or a quad small form-factor pluggable (QSFP)-DD double density module.

Example 3 may include the apparatus of example 1 and/or some other examples herein, wherein the retainer is a spring metal clip, a torsion spring, a fastener, a cable, a chain, a wrap, or a hinge.

Example 4 may include the apparatus of example 1 and/or some other examples herein, wherein the retainer is attached to an outer surface of the container, or inside the container.

Example 5 may include the apparatus of example 1 and/or some other examples herein, wherein the retainer includes stainless steel, carbon steel, or alloy steel, with the tensile strength in a range of 2 lbs to 15 lbs.

Example 6 may include the apparatus of example 1 and/or some other examples herein, wherein the design performance threshold for the container is to cool 10 Watts to 70 degrees Celsius for the container.

Example 7 may include the apparatus of example 1 and/or some other examples herein, wherein the lifetime of the container is in a range of about 50 to 5000 repeated receiving and removal for the various plurality of pluggable circuit modules.

Example 8 may include the apparatus of example 1 and/or some other examples herein, wherein the heat pipe is to be shared by multiple pluggable circuit modules removably received into the plurality of slots of the container.

Example 9 may include the apparatus of example 1 and/or some other examples herein, wherein the heat pipe is a part of a thermal conduction path coupled to the plurality of pluggable circuit modules, and a portion of the thermal conduction path is embedded into a recess of the container.

Example 10 may include the apparatus of example 9 and/or some other examples herein, wherein the thermal conduction path is to include a heat sink or a heat spreader coupled to the heat pipe.

Example 11 may include the apparatus of example 10 and/or some other examples herein, wherein the heat sink or the heat spreader includes copper or aluminum, and is attached to an outer surface of the container by a spring metal clip.

Example 12 may include the apparatus of example 1 and/or some other examples herein, further comprising: a heat sink attached to a portion of a surface of the container, and thermally coupled to the heat pipe, wherein the heat sink is to be in physical and thermal contact with one of the plurality of pluggable circuit modules plugged into the container.

Example 13 may include the apparatus of example 12 and/or some other examples herein, wherein the heat sink is to be in dry contact with the pluggable circuit module.

Example 14 may include the apparatus of example 1 and/or some other examples herein, further comprising: a heat spreader coupled to the heat pipe, wherein a thermal conduction path is to exist between the heat spreader, the heat pipe, and a pluggable circuit module plugged into the container.

Example 15 may include the apparatus of example 14 and/or some other examples herein, wherein the heat spreader is soldered to the heat pipe.

Example 16 may include the apparatus of example 1 and/or some other examples herein, wherein the container is a first container, the plurality of slots are a first plurality of slots, the heat pipe is a first heat pipe, the retainer is a first retainer, the plurality of pluggable circuit modules are a first plurality of pluggable circuit modules, and the apparatus further includes: a second heat pipe to facilitate a second liquid coolant flow to remove thermal energy from a second plurality of pluggable circuit modules removably received into a second plurality of slots of a second container, the second container having the second plurality of slots to removably receive various second plurality of pluggable circuit modules during a lifetime of the second container; and a second retainer to physically and thermally attach the second heat pipe to the second container, the second retainer having a tensile strength sufficient to withstand repeated receiving and removal of the various second plurality of pluggable circuit modules during the lifetime of the second container, without degrading the thermal attachment of the second heat pipe to the second container below a second design performance threshold.

Example 17 may include the apparatus of example 16 and/or some other examples herein, further comprising the first and second containers.

Example 18 may include the apparatus of example 17 and/or some other examples herein, further comprising: a third container, wherein the first container and the second container are placed within the third container; and a cold plate, wherein the cold plate is attached to the third container, and a thermal conduction path exists between the first heat pipe, the second heat pipe, and the cold plate.

Example 19 may include the apparatus of example 18 and/or some other examples herein, wherein the cold plate is to include a third liquid coolant flow to remove thermal energy from a first or second pluggable circuit module removably received into the first or second plurality of slots of the first container or the second container.

Example 20 may include an apparatus with thermal energy management, comprising: a cold plate attached to a first container, wherein the cold plate is to include a first liquid coolant, a second container is to be placed within the first container, and wherein the second container includes a plurality of slots for removably receiving one or more pluggable circuit modules during a lifetime of the second container, and a first heat pipe attached to the second container, the first heat pipe is to include a second liquid coolant, and a thermal conduction path is to exist between a pluggable circuit module plugged into the plurality of slots of the second container, the first heat pipe of the second container, and the cold plate of the first container.

Example 21 may include the apparatus of example 20 and/or some other examples herein, wherein a third container is to be placed within the first container, the third container includes a plurality of slots for removably receiving one or more pluggable circuit modules during a lifetime of the third container, and a second heat pipe attached to the third container, the second heat pipe is to include a third liquid coolant, and a thermal conduction path is to exist between a pluggable circuit module plugged into the third container, the second heat pipe of the third container, and the cold plate of the first container.

Example 22 may include the apparatus of example 21 and/or some other examples herein, wherein there is a pitch in a range of 5 millimeter (mm) to 15 mm between the second container and the third container within the first container.

Example 23 may include a method for managing thermal energy, comprising: attaching a heat pipe to a container by a retainer, the retainer having a tensile strength sufficient to withstand repeated receiving and removal of one or more pluggable circuit modules during a lifetime of the container, without degrading the thermal attachment of the heat pipe to the container below a design performance threshold, wherein the container includes a plurality of slots for removably receiving various plurality of pluggable circuit modules during the lifetime of the container, the heat pipe is to facilitate a liquid coolant flow to remove thermal energy from the various plurality of pluggable circuit modules removably received into the plurality of slots of the container.

Example 24 may include the method of example 23 and/or some other examples herein, further comprising: attaching a heat sink to a portion of a surface of the container, and coupled to the heat pipe, wherein the heat sink is to be in physical contact with a pluggable circuit module plugged into the container.

Example 25 may include the method of example 23 and/or some other examples herein, wherein the container is a first container, and the method further comprising: placing the first container into a second container, wherein the second container includes a cold plate, and a thermal conduction path exists between the heat pipe of the first container and the cold plate of the second container.

Example 26 may include one or more computer-readable media having instructions for managing thermal energy, upon execution of the instructions by one or more processors, to perform the method of any one of examples 23-25.

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An apparatus for managing thermal energy of a computing device, comprising:
    a container having at least first and second slots;
    first and second pluggable circuit modules removably received by the at least first and second slots of the container respectively;
    a first heat sink attached to the container, wherein the first heat sink is in physical and thermal contact with the first pluggable circuit module;
    a second heat sink attached to the container, wherein the second heat sink is in physical and thermal contact with the second pluggable circuit module;
    a heat pipe to facilitate a liquid coolant flow to remove thermal energy from the first and second pluggable circuit modules removably received into the at least first and second slots of the container, wherein the heat pipe is thermally coupled to the first and second heat sinks;
    a retainer to physically and thermally attach the heat pipe to the container; and
    a heat spreader coupled to the heat pipe, to provide a first thermal conduction path among the heat spreader, the heat pipe, the first heat sink, and the first pluggable circuit module, and further to provide a second thermal conduction path among the heat spreader, the heat pipe, the second heat sink, and the second pluggable circuit module, to provide for heat dissipation
    below a design performance threshold, wherein the heat spreader and the heat pipe are mounted directly on an upper surface of the container.

2. The apparatus of claim 1, wherein the first and second pluggable circuit modules include a small form-factor pluggable (SFP) module, a compact small form-factor pluggable (CSFP) module, a quad small form-factor pluggable (QSFP) module, or a quad small form-factor pluggable (QSFP)-DD double density module.

3. The apparatus of claim 1, wherein the retainer is a spring metal clip, a torsion spring, a fastener, a cable, a chain, a wrap, or a hinge.

4. The apparatus of claim 1, wherein the retainer is attached to an outer surface of the container, or inside the container.

5. The apparatus of claim 1, wherein the retainer includes stainless steel, carbon steel, or alloy steel, with the tensile strength in a range of 2 lbs to 15 lbs.

6. The apparatus of claim 1, wherein the design performance threshold for the container is to cool an output power of 10 Watts at an operating temperature of 70 degrees Celsius for the container.

7. The apparatus of claim 1, wherein a lifetime of the container is in a range of about 50 to 5000 repeated receiving and removal of the first and second pluggable circuit modules.

8. The apparatus of claim 1, wherein the heat pipe is to be shared by the first and second pluggable circuit modules removably received into the at least first and second slots of the container.

9. The apparatus of claim 1, wherein at least a portion of the first or second thermal conduction path is embedded into a recess of the container.

10. The apparatus of claim 1, wherein the first or second heat sink or the heat spreader includes copper or aluminum, and is attached to an outer surface of the container by the retainer, wherein the retainer is a spring metal clip.

11. The apparatus of claim 1, wherein the heat spreader is soldered to the heat pipe.

\* \* \* \* \*